(12) United States Patent
Bodlovic et al.

(10) Patent No.: US 7,492,326 B1
(45) Date of Patent: Feb. 17, 2009

(54) BIODEGRADABLE RADIO FREQUENCY IDENTIFICATION CARDS

(75) Inventors: Dani Bodlovic, Zagreb (HR); Ivan Rogan, Zagreb (HR); Robert Berg, Coon Rapids, MN (US); Boris Miksic, North Oaks, MN (US)

(73) Assignee: Cortec Corporation, Saint Paul, MN (US)

( * ) Notice: Subject to any disclaimer, the term of this patent is extended or adjusted under 35 U.S.C. 154(b) by 114 days.

(21) Appl. No.: 11/383,633

(22) Filed: May 16, 2006

Related U.S. Application Data

(63) Continuation-in-part of application No. 11/297,685, filed on Dec. 7, 2005, which is a continuation-in-part of application No. 10/452,535, filed on Jun. 2, 2003, now Pat. No. 6,984,426.

(51) Int. Cl.
*H01Q 1/40* (2006.01)
*G08B 13/14* (2006.01)

(52) U.S. Cl. ................ 343/873; 340/572.1; 340/572.8; 174/257; 174/258; 174/260

(58) Field of Classification Search ................ 174/250, 174/255–258, 260; 428/209; 340/572.1, 340/572.8; 343/873
See application file for complete search history.

(56) References Cited

U.S. PATENT DOCUMENTS 5,216,050 A    6/1993   Sinclair
5,444,113 A    8/1995   Sinclair et al.
5,658,646 A *  8/1997   Takano et al. ............ 428/195.1
5,760,118 A    6/1998   Sinclair et al.
5,834,582 A   11/1998   Sinclair et al.
5,883,199 A *  3/1999   McCarthy et al. ........... 525/437
6,028,160 A *  2/2000   Chandler et al. ............ 528/176
6,156,929 A * 12/2000   Chandler et al. ............ 562/582
6,323,307 B1  11/2001   Bigg et al.
6,512,174 B2 * 1/2003   Mori et al. .................. 174/520
6,787,613 B2 * 9/2004   Bastioli et al. .............. 525/411
6,984,426 B2   1/2006   Miksic et al.
7,198,182 B1 * 4/2007   Schulman .................... 223/87

FOREIGN PATENT DOCUMENTS

| EP | 1 227 129 A1 | 7/2002 |
|----|--------------|--------|
| EP | 1 227 130 A1 | 7/2002 |
| GB | 2 231 027 A  | 7/1990 |
| JP | 2001-239634  | 9/2001 |
| JP | 2002-293961  | 10/2002 |
| JP | 2002-327107  | 11/2002 |
| JP | 2002-348445  | 12/2002 |
| JP | 2003-64245   | 3/2003 |
| JP | 2003-82212   | 3/2003 |
| WO | WO 02/059200 A1 | 8/2002 |
| WO | WO 02/059201 A1 | 8/2002 |

* cited by examiner

*Primary Examiner*—Cathy Lam
(74) *Attorney, Agent, or Firm*—Haugen Law Firm PLLP

(57) ABSTRACT

A biodegradable RFID card includes a multiple-layer laminate with each layer being formed of a biodegradable material composition of a blend of between about 30-70% PLA and about 30-70% by weight of one or more polyesters. The biodegradable RFID card further includes an RFID assembly disposed on at least one of the laminate layers, with the RFID assembly including an integrated circuit and an antenna.

7 Claims, 3 Drawing Sheets

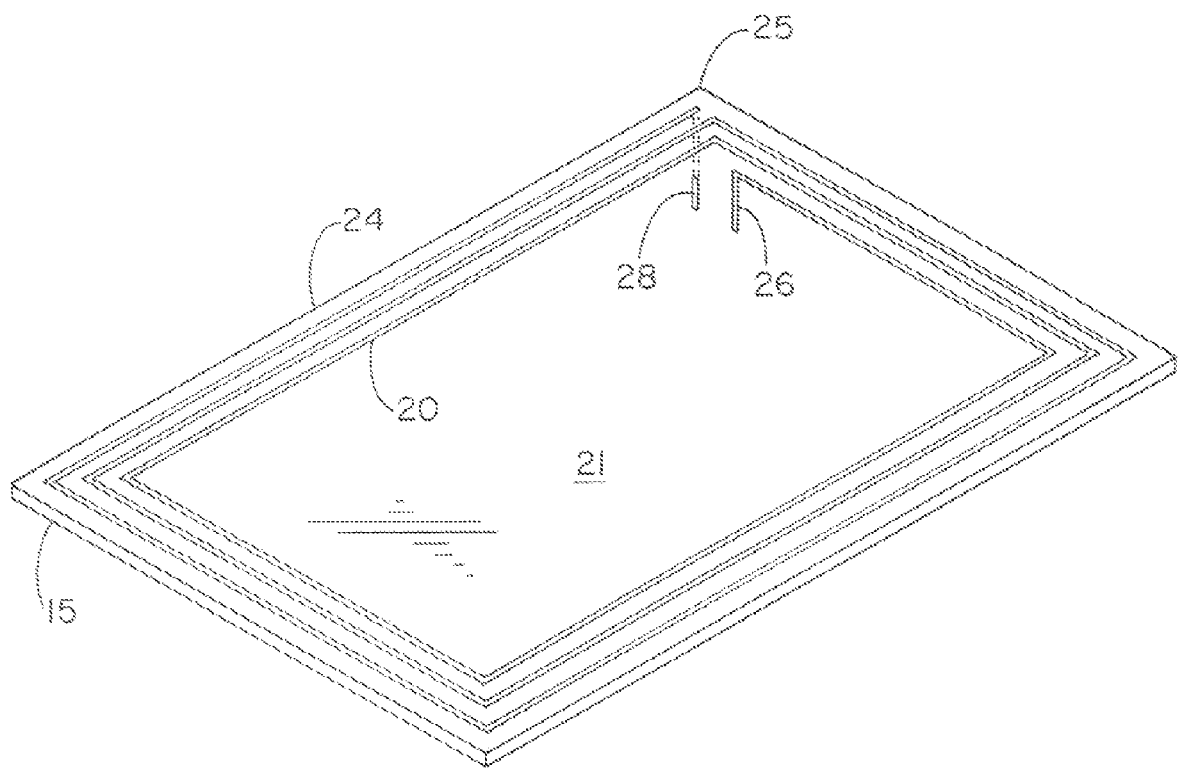

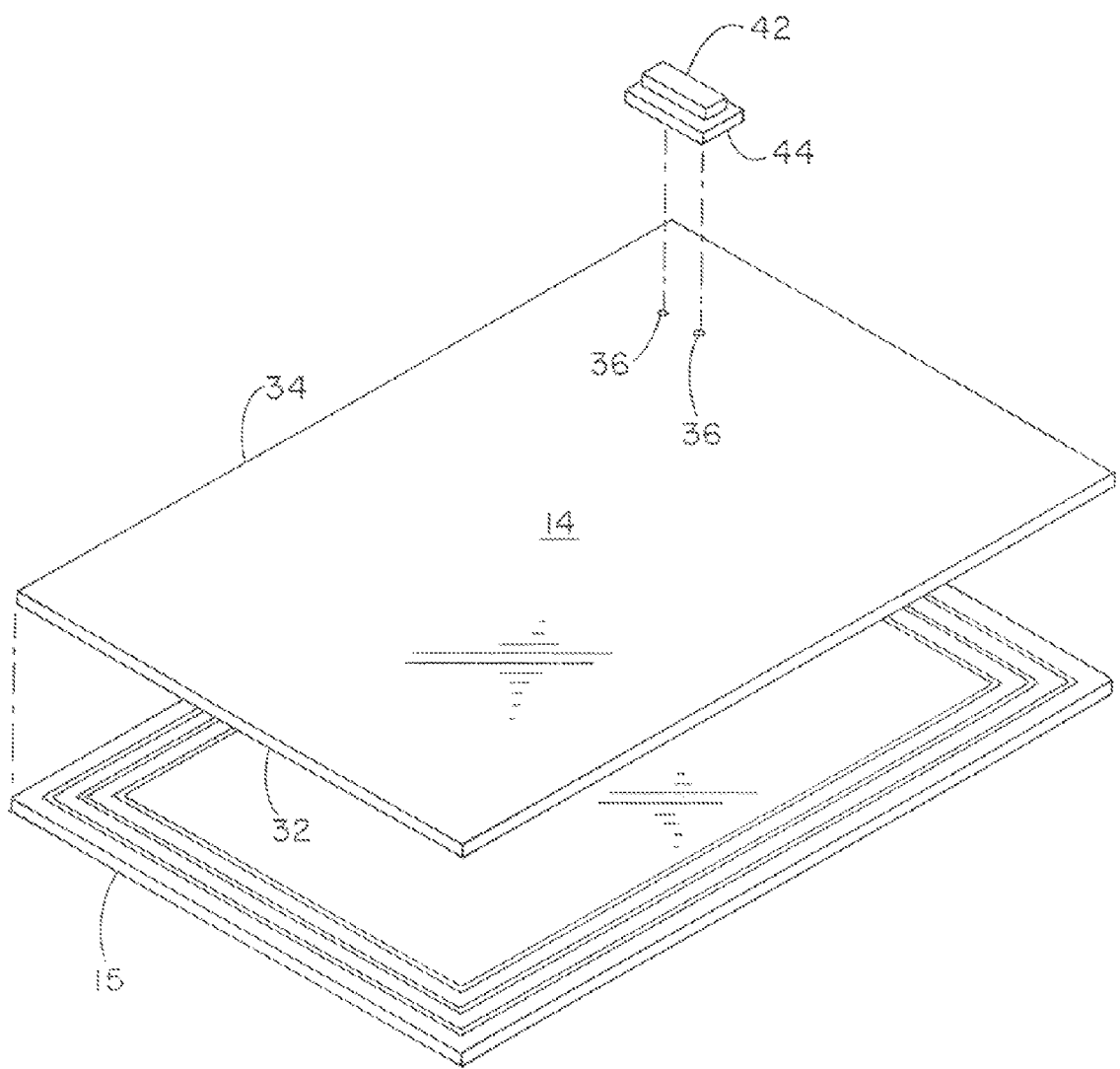

BIODEGRADABLE RADIO FREQUENCY IDENTIFICATION CARDS

CROSS REFERENCE TO RELATED APPLICATIONS

This application is a continuation-in-part of U.S. patent application Ser. No. 11/297,685, filed on Dec. 7, 2005 and entitled "BIODEGRADABLE TIES", which itself is a continuation-in-part of U.S. patent application Ser. No. 10/452,535, now U.S. Pat. No. 6,984,426, filed on Jun. 2, 2003 and entitled "BIODEGRADABLE BAGS", the contents of which are herein incorporated in their entirety.

FIELD OF THE INVENTION

This invention relates to biodegradable materials generally, and more particularly to biodegradable resin blends used to create biodegradable cards incorporating circuitry enabling radio frequency identification.

BACKGROUND OF THE PRIOR ART

Biodegradable materials have long been studied for their applicability in commonly-used products. Recently, increased emphasis has been placed on developing products made from biodegradable materials as replacements for existing, non-biodegradable products. In fact, some governmental regulations call for the phasing out of certain non-biodegradable products in lieu of biodegradable counterparts.

The changeover to the utilization of biodegradable materials in such products, however, has been met with both implementation challenges, as well decreased performance issues. Furthermore, products fabricated from biodegradable materials have typically been more expensive than conventional non-biodegradable products. Such issues have limited the extent to which products fabricated from biodegradable materials have been widely accepted in residential or industrial applications alike.

A particular example of a product that is well suited for the use of biodegradable material is a radio frequency identification card that may be utilized in a variety of applications.

To qualify as "biodegradable", materials forming the biodegradable product must have at least a 90% conversion rate of starting material to $CO_2$ and water within six months of disposal thereof. Products fabricated from biodegradable materials that have been utilized to date, however, do not perform as well strength wise as conventional products, and are typically more expensive than such conventional products.

A specific drawback to currently available biodegradable materials is the low strength characteristics associated with such materials. Accordingly, currently available biodegradable products are undesirably weak, in that such products are excessively stretchable under relatively low forces.

To date, efforts in creating viable and economical fully biodegradable materials have focused primarily on blending known biodegradable polymeric resins such as polyesters with starch to reduce the cost. A popular blend is a resin mixture called Mater-Bi produced and sold by Novamont. Bags made from the Mater-Bi material are widely available, but have substantial physical drawbacks such as low elongation resistance, low puncture resistance, and poor moisture resistance.

Two primary problems to be overcome in order to increase acceptance and use of biodegradable products are strength and price. Polyethylene, one of the most commonly used polymeric resin base for non-biodegradable films used in the manufacture of a wide variety of products is a low cost resin that is versatile enough to handle the physical requirements of common applications. Polyethylene products are also typically less expensive than their biodegradable counterparts. Such characteristics of polyethylene represent a marketing barrier to the acceptance of alternative biodegradable products.

We have surprisingly found that commonly-utilized biodegradable polymeric resins can be blended with a polylactic acid to produce substantially stronger fully biodegradable materials than those presently available. A particular characteristic of the resulting material is reduced elongation under load. Thus, the blends of the present invention enable the production of substantially more durable biodegradable products. In addition, the biodegradable products of the present invention are typically less costly to produce than currently manufactured biodegradable products. Such factors are important in increasing acceptance of biodegradable products in environmental programs worldwide.

Lactic acid polymers have been extensively investigated for many years. Primarily, attention has been focused on the biodegradable aspects of such lactic acid polymers. A great deal of work in the last twenty years centered on the medical use of these polymers, upon which many patents have issued. A patent related to uses for polylactic acid is U.S. Pat. No. 6,323,307, issued to Cargill Dow Polymers on Nov. 27, 2001.

Other patents relating to the use of polylactic acid include U.S. Pat. Nos. 5,216,050 and 5,444,113. Such patents generally describe polylactic acid polymers that can be blended or plasticized with internal or external plasticizers.

The invention of the present application describes a simple straightforward method of using PLA to produce useful products for a rapidly growing environmental problem. The products of the present application are unexpectedly tougher, stronger, can handle much heavier loads, and use less resin than conventional biodegradable products currently available.

It is therefore a primary object of the present invention to provide fully biodegradable product forms having strength characteristics similar to that of polyethylene.

It is another object of the present invention to provide economical biodegradable products having enhanced strength and durability characteristics.

It is a still further object of the present invention to provide biodegradable products comprising a blended product of polylactic acid and a suitable biodegradable polymeric resin, such as a polyester.

It is a yet further object of the present invention to provide biodegradable products comprising a blended product of between about 30% and 70% by weight polylactic acid, and between about 30% and 70% by weight of a suitable biodegradable polymeric resin.

It is another object of the present invention to provide biodegradable products being formed from a plurality of biodegradable film layers, which layers are a blended product of polylactic acid and a biodegradable polyester resin.

It is another object of the present invention to provide a biodegradable card product incorporating RFID hardware.

SUMMARY OF THE INVENTION

By means of the present invention, a biodegradable multiple-layer laminate construction is provided for supporting an RFID assembly. The laminate structure forms a biodegradable RFID card that may be utilized in a variety of applications.

In a particular embodiment, the biodegradable RFID card of the present invention includes a multiple-layer laminate, with each layer being formed of a biodegradable material composition of a blend of between about 30-70% PLA and about 30-70% of one or more polyesters. At least one of the one or more polyesters is an aliphatic aromatic co-polyester having a melt flow rate of less than 5 g/10 min. The biodegradable RFID card further includes a RFID assembly disposed on at least one of the laminate layers, with the RFID assembly including an integrated circuit and an antenna.

BRIEF DESCRIPTION OF THE DRAWINGS

FIG. 2 is an isolation perspective view of a portion of the biodegradable RFID card illustrated in FIG. 1; and FIG. 3 is an isolation perspective view of a portion of the biodegradable RFID card illustrated in FIG. 1.

DETAILED DESCRIPTION OF THE PREFERRED EMBODIMENTS

Figure 1:
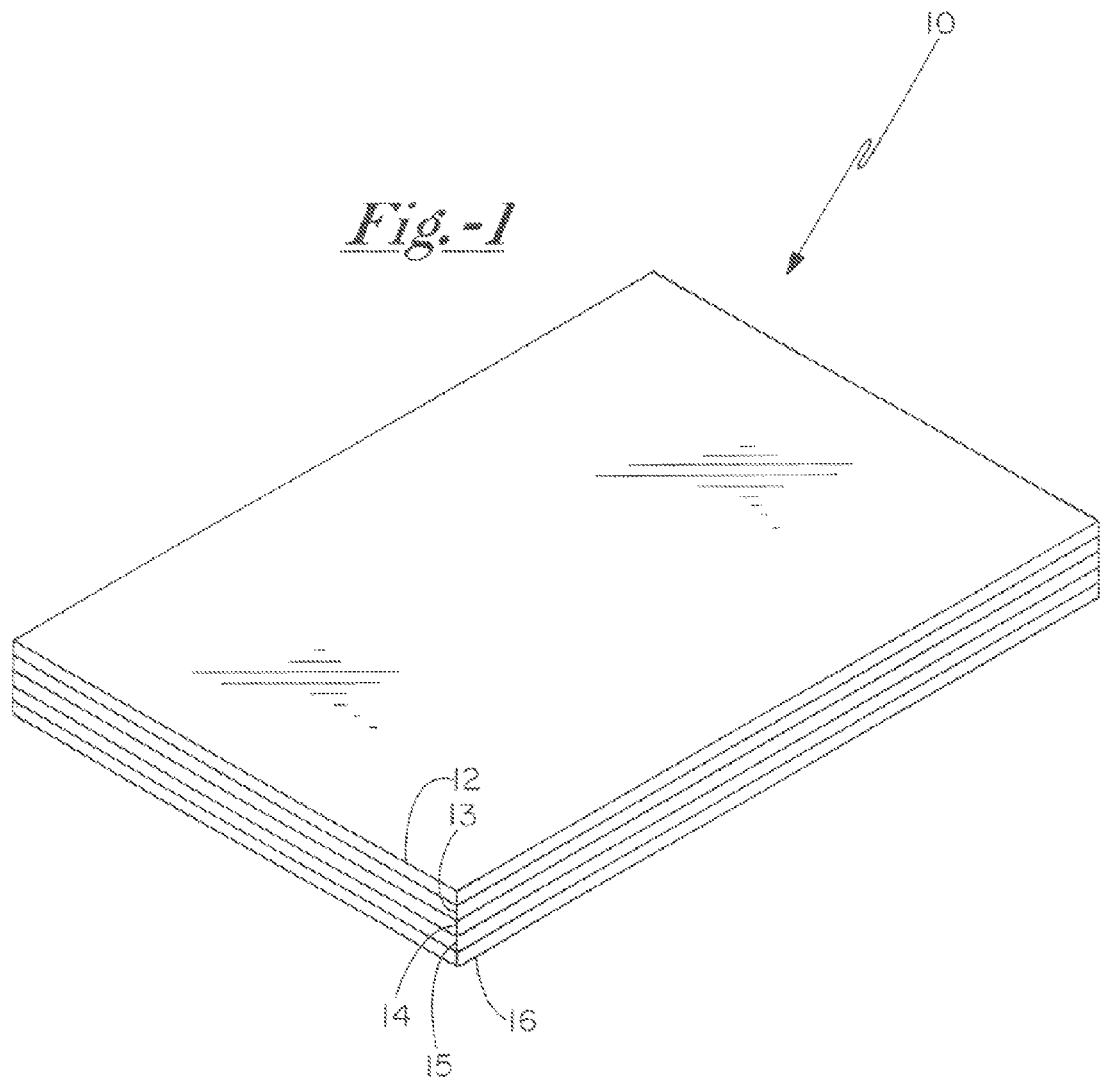
FIG. 1 is a perspective view of a biodegradable RFID card of the present invention.

The objects and advantages enumerated above together with other objects, features, and advances represented by the present invention will now be presented in terms of detailed embodiments. Other embodiments and aspects of the invention are recognized as being within the grasp of those having ordinary skill in the art.

Polylactic acid (PLA), which is marketed by Cargill-Dow under the trade name Cargill-Dow 4042, is typically used for producing biodegradable utensils. Films that are prepared from PLA are stiff, have little elongation and poor tear strength, but are finding some use as food wrappers, lid tops and other applications in which strength and elongation characteristics are not critical.

The present invention has revealed that PLA, when blended with a biodegradable resin such as polyester, forms a starting material mixture that can be processed into products such as cards having desired physical properties not previously achieved in fully biodegradable materials. A variety of materials may be selected for use with the PLA in obtaining a suitable resin blend. Preferably, such materials provide added resiliency characteristics to the blended product. In addition, such materials are preferably biodegradable, whereby the blended product is fully degradable, with the PLA component and the other resin components each being biodegradable. In some embodiments of the present invention, each of the biodegradable components in the blended product biodegrade at similar rates throughout the biodegradation process.

A particular example of a biodegradable resin material that is useful in blends of the present invention with PLA is polyester, which is well known as a biodegradable polymeric material, and is utilized in a variety of applications. Other biodegradable resins, however, may be utilized in blended products of the present invention, so long as a portion of the blend comprises PLA. One polyester resin material particularly useful in compositions of the present invention is sold by BASF under the trade name "Ecoflex FBX 7011".

The polyester resin "Ecoflex FBX 7011" is most preferred for use in the manufacture of the biodegradable products of the present invention. It has been discovered by the Applicants that such an aliphatic aromatic copolyester resin renders a biodegradable product with suitable properties while enhancing the efficiency and effectiveness of extrusion processes typically utilized to create the biodegradable products of the present invention. In particular, the aliphatic aromatic copolyester resin utilized in the present invention is preferably one that exhibits a melt flow rate of less than about 5 g/10 min. Such a melt flow rate has been found to provide enhanced processing characteristics, as well as desired physical and biodegradable characteristics of the products of the present invention.

Other polyester materials, however, may likewise be utilized in the compositions of the present invention. Example alternative or additional polyesters that have been identified by the Applicant as being useful in the compositions of the present invention include "Ecoflex SL1" and "Ecoflex ABI", both of which being sold by BASF.

A preferred embodiment of the present invention is illustrated in FIG. 1, wherein a biodegradable card 10 includes a plurality of layers 12-16 that are laminated to one another. Preferably, each of such layers 12-16 are fabricated from a biodegradable material composition of a blend of between about 30-70% PLA, and about 30-70% of one or more polyesters. In preferred embodiments, at least one of the one or more polyester materials consists of the aliphatic aromatic co-polyester resin describe above with reference to "Ecoflex FBX 7011".

Individual layers 12-16 of card 10 are preferably formed as films, through extrusion processes or otherwise. A preferred method for performing each layer 12-16 of the present invention is described in U.S. Pat. No. 6,984,426, which is assigned to the same Assignee as in the present application, and is herein incorporated by reference.

The individual film layers are preferably bonded to one another through, for example, a lamination process in order to form card 10. Utilizing the film compositions described above, layers 12-16 may be laminated to one another in a conventional lamination process operating at between about 250-350° F. In preferred embodiments, each of layers 12-16 is about 0.2 mm in thickness, though other thicknesses are contemplated as being useful in layers 12-16 of card 10 of the present invention. Depending upon the number of layers utilized, card 10 preferably has a total thickness of between about 0.4 and 1.0 mm. It has been found that such thickness for a final biodegradable RFID card is desired.

As illustrated in the isolation view of FIG. 2, an antenna 20 is preferably disposed upon first surface 21 of carrier layer 15. Antenna 20 is preferably an electrically conductive material that is disposed substantially along perimeter 24 of first surface 21 of carrier layer 15. Antenna 20 may be fabricated from a variety of electrically conductive materials, such as metals, doped polymeric materials, and the like. In a particular embodiment, antenna 20 is fabricated from biodegradable polymeric resin doped with carbon black. Such composition may be, for example, between about 60-90% by weight of a blend of polylactic acid and polyester, balance carbon black. A composition including 70 parts by weight PLA, 30 parts by weight aliphatic aromatic co-polyester and 20 parts by weight carbon black has been determined to be useful in conducting electricity along first surface 21 of carrier layer 15.

As further shown in FIG. 2, antenna 20 is preferably wrapped in a nested relationship about perimeter 24 of carrier layer 15. First and second ends 26, 28 of continuous antenna 20 are preferably positioned at corner 25 of carrier layer 15. In order to preserve electrical isolation throughout the length of antenna 20, each sequential nested circumference of antenna 20 is spaced from an adjacent circumference of antenna 20. Moreover, end 28 crosses the remaining turns of antenna 20 underneath carrier layer 15, and is re-exposed to first surface 21 adjacent to, but spaced from, end 26 of antenna 20 at corner 25.

As shown in FIG. 3, cover layer 14 preferably includes first and second opposed surfaces 32, 34, and is operably positioned in superimposed relationship over first surface 21 of carrier layer 15. Cover layer 14 is illustrated in FIG. 3 as being spaced from carrier layer 15 only for purposes of this description. In final form, cover layer 14 is preferably laminated to first surface 21 of carrier layer 15.

Preferably, apertures 36 are formed in cover layer 14 through conventional milling or perforation processes. Such apertures 36 enable connection of antenna 20 to integrated circuit 42, which is preferably disposed upon a silicon wafer 44. The combination of integrated circuit 42 and silicon wafer 44 is commonly referred to as a die. Coupling of the die to antenna 20 is preferably accomplished through a conventional technique widely known as the "flip-bonding" process. As shown in FIG. 3, integrated circuit 42 is preferably disposed at second surface 34 of cover layer 14, such that integrated circuit 42 is electrically isolated from the windings of antenna 20. However, other relative orientations for integrated circuit 42 and antenna 20 making up RFID assembly at one or more of carrier layer 15 and cover layer 14 are contemplated by the present invention. The remaining layers of biodegradable card 10 may be optionally provided for protection and/or cosmetic purposes.

Biodegradable card 10 is preferably utilized as an identification tag and may be used in a variety of applications. For example, biodegradable card 10 may be utilized in both single and repetitive use applications. A particularly preferred application is in luggage ticketing for security purposes.

It is anticipated that the biodegradable card, in its typical usage environment, retains its physical and operational properties for substantially as long as conventional RFID card materials. However, upon exposure of biodegradable card 10 to a soil-like environment, degradation of the biodegradable materials initiates quickly, and is typically completed within about 8-10 weeks of initial exposure.

A preferred configuration and method of construction of biodegradable card 10 of the present invention is described below with reference to Example 1. Such example, however, is provided herein as one of many possible configurations and methods for construction contemplated by the present invention.

Example 1

A resin mixture was prepared in accordance with the following concentrations:

| Material | % by Weight |
| --- | --- |
| PLA | 70% |
| Ecoflex SL1 | 2.5% |
| Ecoflex ABI | 5% |
| Ecoflex FBX 7100 | 22.5% |

Upon thorough blending, a 0.205 mm film was extruded from a die maintained at a temperature of about 165° C. The film was cut into individual pieces measuring 2 cm in width and 4 cm in length.

Silver paste wiring was wrapped about the perimeter of a first surface of a selected film segment, with the silver paste being wound into four nested segments. A second selected film segment was placed in superimposed orientation over the first surface of the first selected film segment, and the two film segments were laminated to one another at 250° F. Apertures were milled into the second selected film layer to provide for connection of the die. Connection was obtained through a flip-bonding process. Finished film layers were laminated over the first and second selected film layers at 250° F., respectively, to complete the construction of the biodegradable RFID card.

The invention has been described herein in considerable detail in order to comply with the patent statutes, and to provide those skilled in the art with the information needed to apply the novel principles and to construct and use embodiments of the invention as required. However, it is to be understood that the invention can be carried out by specifically different devices and that various modifications can be accomplished without departing from the scope of the invention itself.

What is claimed is:

1. A biodegradable RFID card comprising:
   (a) a multiple layer laminate, with each layer comprising a biodegradable material composition of a blend of between about 30-70% polylactic acid and about 30-70% of one or more polyesters, with at least one of said one or more polyesters consisting of an aliphatic aromatic co-polyester having a melt flow rate of less than about 5 g/10 min; and
   (b) an RFID assembly including an integrated circuit electrically coupled to an antenna, said antenna being formed as a discrete trace of electrically conductive material disposed on a first outer surface of one of said laminate layers.

2. A biodegradable RFID card as in claim 1 wherein said laminate includes a carrier layer and a cover layer, and said antenna is disposed substantially along a perimeter of said carrier layer.

3. A biodegradable RFID card as in claim 2 wherein said cover layer includes opposed first and second surfaces, with said cover layer being laminated to said carrier layer such that respective said first surfaces of said carrier layer and said cover layer are oriented in facing relationship with one another.

4. A biodegradable RFID card as in claim 3 wherein said integrated circuit is disposed on said second surface of said cover layer.

5. A biodegradable RFID card as in claim 4 wherein said integrated circuit is coupled to said antenna through a flip-bonding process.

6. A biodegradable RFID card as in claim 1 wherein said antenna is an electrically conductive polymeric resin-based material.

7. A biodegradable RFID card as in claim 6 wherein said polymeric resin-based material is about 60-90% by weight of said biodegradable material composition blend polyester and about 10-40% by weight carbon black.

* * * * *

UNITED STATES PATENT AND TRADEMARK OFFICE
CERTIFICATE OF CORRECTION

PATENT NO. : 7,492,326 B1
APPLICATION NO. : 11/383633
DATED : February 17, 2009
INVENTOR(S) : Dani Bodlovic et al.

Page 1 of 1

It is certified that error appears in the above-identified patent and that said Letters Patent is hereby corrected as shown below:

claim 7, column 6 line 57 delete "polyester".

Signed and Sealed this

Thirty-first Day of March, 2009

JOHN DOLL
*Acting Director of the United States Patent and Trademark Office*